United States Patent
You

(10) Patent No.: US 9,477,267 B2
(45) Date of Patent: Oct. 25, 2016

(54) WIRE CONTROLLED SUPPORT ASSEMBLY AND ELECTRONIC DEVICE INCLUDING THE SAME

(71) Applicant: Wistron Corporation, New Taipei (TW)

(72) Inventor: Gang You, New Taipei (TW)

(73) Assignee: Wistron Corporation, New Taipei (TW)

( * ) Notice: Subject to any disclaimer, the term of this patent is extended or adjusted under 35 U.S.C. 154(b) by 160 days.

(21) Appl. No.: 14/567,011

(22) Filed: Dec. 11, 2014

(65) Prior Publication Data
US 2015/0366090 A1   Dec. 17, 2015

(30) Foreign Application Priority Data

Jun. 11, 2014  (CN) .......................... 2014 1 0258225

(51) Int. Cl.
| | | |
|---|---|---|
| *G06F 1/16* | (2006.01) | |
| *F16M 11/00* | (2006.01) | |
| *F16M 11/06* | (2006.01) | |
| *H05K 5/02* | (2006.01) | |

(52) U.S. Cl.
CPC .............. *G06F 1/166* (2013.01); *F16M 11/00* (2013.01); *F16M 11/06* (2013.01); *H05K 5/0234* (2013.01)

(58) Field of Classification Search
CPC ...... G06F 1/166; F16M 11/00; F16M 11/06; H05K 5/0234
USPC ............ 361/679.59, 807, 809; 248/397, 688, 248/920
See application file for complete search history.

(56) References Cited

U.S. PATENT DOCUMENTS

| | | | |
|---|---|---|---|
| 6,606,762 B1 * | 8/2003 | Levine .................. | G06F 1/1626 16/286 |
| 8,255,015 B2 * | 8/2012 | Wang .................... | G06F 1/1626 455/575.1 |
| 2009/0244872 A1 * | 10/2009 | Yan ......................... | H04M 1/04 361/807 |
| 2011/0247252 A1 * | 10/2011 | Chen ...................... | F16M 11/04 40/745 |

FOREIGN PATENT DOCUMENTS

TW           I377001           11/2012

* cited by examiner

*Primary Examiner* — James Wu
(74) *Attorney, Agent, or Firm* — Brinks Gilson & Lione; John C. Bacoch

(57) ABSTRACT

An electronic device includes a housing with a base wall, a support unit and a control wire unit. The support unit includes a connecting member and a supporting member. The connecting member is connected to the base wall and has a connection portion. The supporting member has an engaging piece connected to the connection portion to vary an included angle between the supporting member and the base wall. The control wire unit includes a winding mechanism, a wire member and a control mechanism. The control mechanism is operable to control the winding mechanism to adjust an unwound length of the wire member for controlling the included angle between the supporting member and the base wall.

20 Claims, 18 Drawing Sheets

US 9,477,267 B2

WIRE CONTROLLED SUPPORT ASSEMBLY AND ELECTRONIC DEVICE INCLUDING THE SAME

CROSS-REFERENCE TO RELATED APPLICATION

This application claims priority of Chinese Application No. 201410258225.7, filed on Jun. 11, 2014.

FIELD OF THE INVENTION

The invention relates to a wire controlled support assembly and an electronic device including the same.

BACKGROUND OF THE INVENTION

With the progress of the miniaturization and multifunctionalization of electronic components, an electronic device, such as a liquid crystal display device, or an all-in-one (AIO) computer that includes an integration of a display screen and a computer mainframe, etc., tends to become slim.

Since a main body of a conventional display device or AIO computer has a relatively large size, a support frame or a support seat is usually connected to the main body to facilitate adjustment of an inclination angle of a display screen thereof by a user. Because the support frame of the conventional display device or AIO computer protrudes outwardly from the main body, the overall size of the conventional display device or AIO computer is increased and an overall appearance has irregular projections. A relatively large packing box is thus used to package the electronic device. However, since a relatively significant inner space of the packing box is unoccupied by the electronic device, not only is the packaging cost increased, but the cost of fillers for filling the unoccupied space of the packing box is also increased.

Furthermore, the support frame or the support seat of the conventional electronic device can only permit adjustment of the inclination angle of the main body of the conventional electronic device in a single direction. For example, when the longitudinal side of the display screen is placed horizontally, the support frame or seat allows an adjustment of a forward/rearward inclination angle of the display screen. If the display screen is rotated 90 degrees such that the longitudinal side thereof is placed vertically, the support frame or the support seat will rotate leftward or rightward together with the main body, thereby failing to perform its supporting and angle-adjusting functions.

SUMMARY OF THE INVENTION

Therefore, an object of the present invention is to provide an electronic device with a wire controlled support assembly that is relatively lightweight, and that is easy for storing and packaging.

Another object of the present invention is to provide a wire controlled support assembly.

According to one aspect of the present disclosure, an electronic device includes a housing, a support unit and a control wire unit. The housing includes a base wall and a side wall transversely connected to the base wall. The base wall has an opening. The support unit includes a connecting member and a supporting member. The connecting member is connected to the base wall and has a connection portion corresponding in position to the opening. The supporting member has an engaging piece connected to the connection portion, a propping rod extending outwardly of the opening from the engaging piece, a first wire fixing part connected to one end of the propping rod and distal from the engaging piece, and a wire channel formed in the propping rod in a longitudinal direction of the propping rod and extending from the engaging piece to the first wire fixing part. The supporting member is pivotable relative to the base wall through a connection of the connection portion and the engaging piece to vary an included angle between the supporting member and the base wall. The control wire unit includes a winding mechanism, a wire member and a control mechanism. The winding mechanism is disposed on an inner side of the base wall, and has a winding shaft rotatable relative to the base wall and a shaft-limiting unit connected to the winding shaft for limiting the winding shaft. The wire member has a wire, and a positioning part connected to the first wire fixing part. The wire is wound on the winding shaft, and has one end secured to the winding shaft and another end connected to the positioning part. The wire member extends through the connection portion and the opening to enable the positioning part to be secured to the first wire fixing part so that part of the wire is received stretchedly within the wire channel. The control mechanism is connected to the winding mechanism and has a control member disposed on the side wall to be operated by a user. The control member is operable to control the winding mechanism so as to adjust a length of an unwound part of the wire member for control of a pivoting movement of the supporting member and the included angle between the supporting member and the base wall.

In the aforesaid electronic device, the supporting member is removably connected to the connecting member. The connecting member further has a second wire fixing part proximate to the connection portion. The second wire fixing part secures the positioning part when the supporting member is removed from the connecting member.

In the aforesaid electronic device, the connecting member further has a mounting seat, a pivot seat and a connecting rod. The mounting seat is disposed on the inner side of the base wall and coves the opening. The pivot seat is connected pivotally to the mounting seat. The connecting rod is connected rotatably to the pivot seat and has an end portion serving as the connection portion. The connecting rod is pivotable relative to the base wall by means of the pivot seat and is able to extend out of the opening to protrude from the base wall and to rotate about its own axis.

In the aforesaid electronic device, the mounting seat extends in a direction transverse to the winding shaft, and has a connecting wall that contacts the base wall and that is elongated between the winding shaft and the opening, an arched wall that is connected face to face to the connecting wall to form a tubular body with the connecting wall and that extends beyond the connecting wall to cover the opening, and a wire guide groove formed in the arched wall and extending in the direction transverse to the winding shaft. The pivot seat has a seat body and a pivot pin projecting from two opposite sides of the seat body. The pivot pin is inserted rotatably into the arched wall. Part of the wire is stretchedly received in the wire guide groove.

In the aforesaid electronic device, the connection portion has a socket, the engaging piece has a ball, and the connection portion and the engaging piece cooperatively form a ball-and-socket joint.

In the aforesaid electronic device, the wire channel cuts through the ball of the engaging piece.

In the aforesaid electronic device, the winding mechanism further has a plurality of shaft mounts that protrude from the base wall and that hold the winding shaft. The shaft-limiting unit has a gear set through which the winding shaft coaxially extends. The gear set has a stationary gear, and a displacement gear separably and coaxially meshed with the stationary gear. The stationary gear is stationarily mounted to one of the shaft mounts. The displacement gear is rotatable concomitantly with the winding shaft. The winding shaft is controlled by the control member to move between a locked position where the displacement gear meshes with the stationary gear and an unlocked position where the displacement gear separates from the stationary gear.

In the aforesaid electronic device, the shaft-limiting unit further has a resilient member sleeved on the winding shaft. The resilient member urges the winding shaft to move to the locked position.

In the aforesaid electronic device, the side wall has a restricting hole extending therethrough. The restricting hole has a small-hole portion and a large-hole portion that is larger than and juxtaposed in communication with the small-hole portion along a direction perpendicular to the base wall. The control mechanism further has an operator connector connected to an end portion of the winding shaft. The operator connector has a restricting groove aligned with the restricting hole. The end portion of the winding shaft has an end surface that is disposed in the restricting groove and that is aligned with the small-hole portion. The winding shaft has a shaft toothed portion disposed on the end surface and along an axis of the winding shaft. The control member has an operator wheel disposed outwardly on the side wall, and a connecting bar extending from the operator wheel through the restricting hole. The connecting bar has a root portion connected to the operator wheel, a head portion disposed away from the operator wheel, a main bar section interconnecting and being smaller in cross-section than the root portion and the head portion, and a bar toothed portion disposed on the head portion and along an axis of the connecting bar. The root portion has a diameter smaller than that of the large-hole portion and greater than that of the small-hole portion. The main bar section has a diameter smaller than that of the small-hole portion. The head portion is received and is slidable along a direction perpendicular to the base wall in the restricting groove. The operator wheel is operable to move the connecting bar into the large-hole portion so that the winding shaft is in the locked position. The operator wheel is pullable outward to move the root portion out of the side wall through the large-hole portion so that the winding shaft is in the unlocked position, and to further move the main bar section to the small-hole portion until the root portion is positioned outside of the small-hole portion so that the bar toothed portion is engaged with the shaft toothed portion to permit the operator wheel to rotate the winding shaft while the winding shaft is placed in the unlocked position.

In the aforesaid electronic device, the positioning part is in the form of a ball.

The support unit and the control wire unit of the electronic device according to the present invention are operable to provide various supporting modes for meeting different demands in application. Further, the support unit and the control wire unit has a reduced weight because of the lightweight structures thereof. In addition, the base wall of the housing may have a flat outer surface since the supporting member is removable, and the supporting member is substantially flat. Therefore, it is convenient to package, store, transport and carry the electronic device.

BRIEF DESCRIPTION OF THE DRAWINGS

Other features and advantages of the present invention will become apparent in the following detailed description of the embodiment with reference to the accompanying drawings, of which.

DETAILED DESCRIPTION OF THE EMBODIMENT

Figure 8:
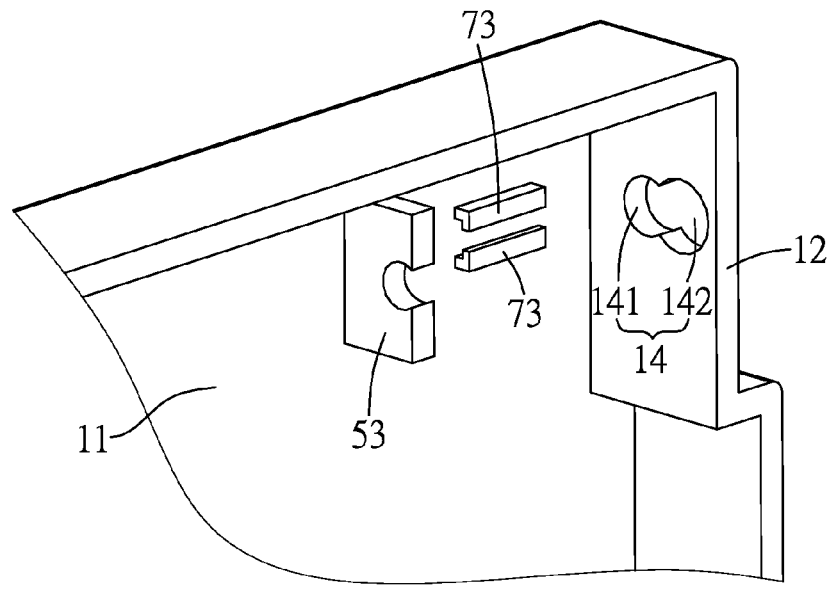
FIG. 8 is a fragmentary perspective view of the embodiment illustrating a part of the control wire unit and a part of the housing.
Figure 9:
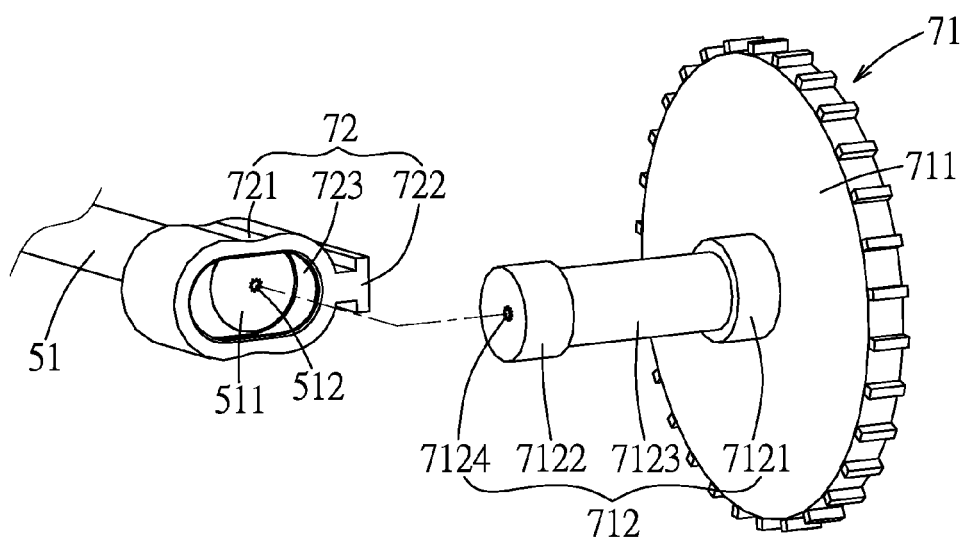
FIG. 9 is a fragmentary exploded perspective view of the embodiment illustrating the control mechanism and the winding mechanism.

Referring to FIGS. 1 to 5, the embodiment of an electronic device 100 according to the present invention is illustrated. The electronic device 100 includes a housing 1, a display screen 2, a support unit and a control wire unit. The housing 1 includes a base wall 11 and a side wall 12 transversely connected to the base wall 11. The base wall 11 has an opening 13. The side wall 12 perpendicularly projects from an outer periphery of the base wall 11 so as to extend around the base wall 11. Specifically, the side wall 12 has a restricting hole 14 extending therethrough. The restricting hole 14 has a small-hole portion 141 and a large-hole portion 142 that is larger than and juxtaposed in communication with the small-hole portion 141 along a direction perpendicular to the base wall 11 (as shown in FIG. 8). The display screen 2 is assembled with the housing 1. In this disclosure, the electronic device 100 is exemplified as an all-in-one (AIO) computer.

Figure 6:
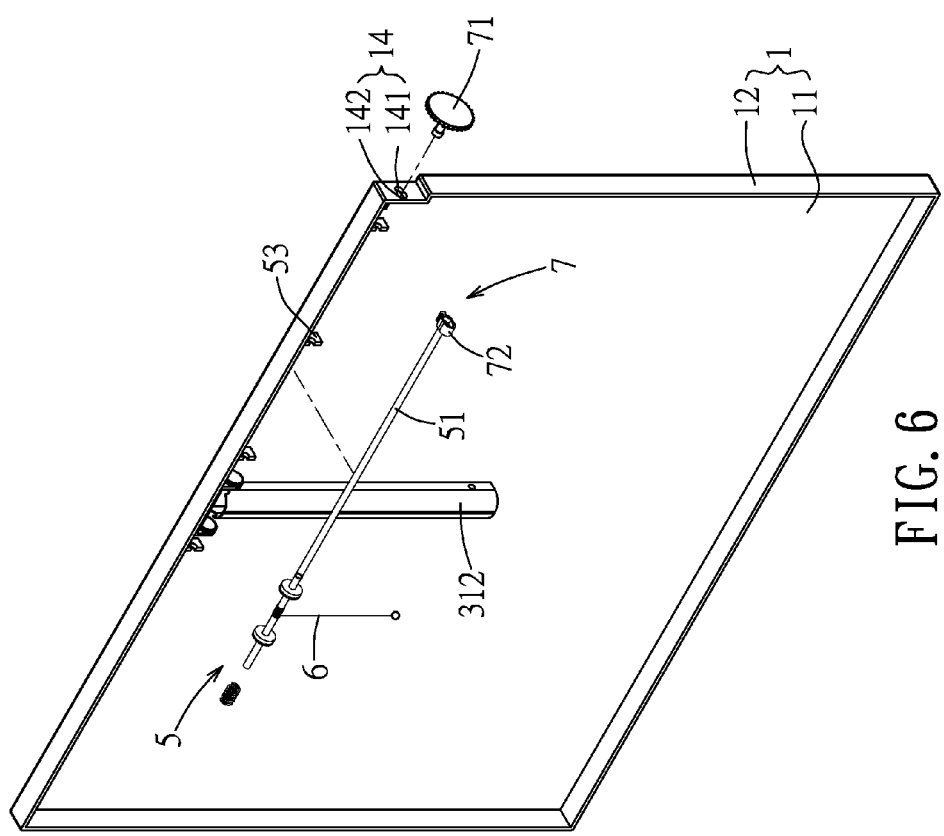
FIG. 6 is an exploded perspective view illustrating a control wire unit of the embodiment.
Figure 7:
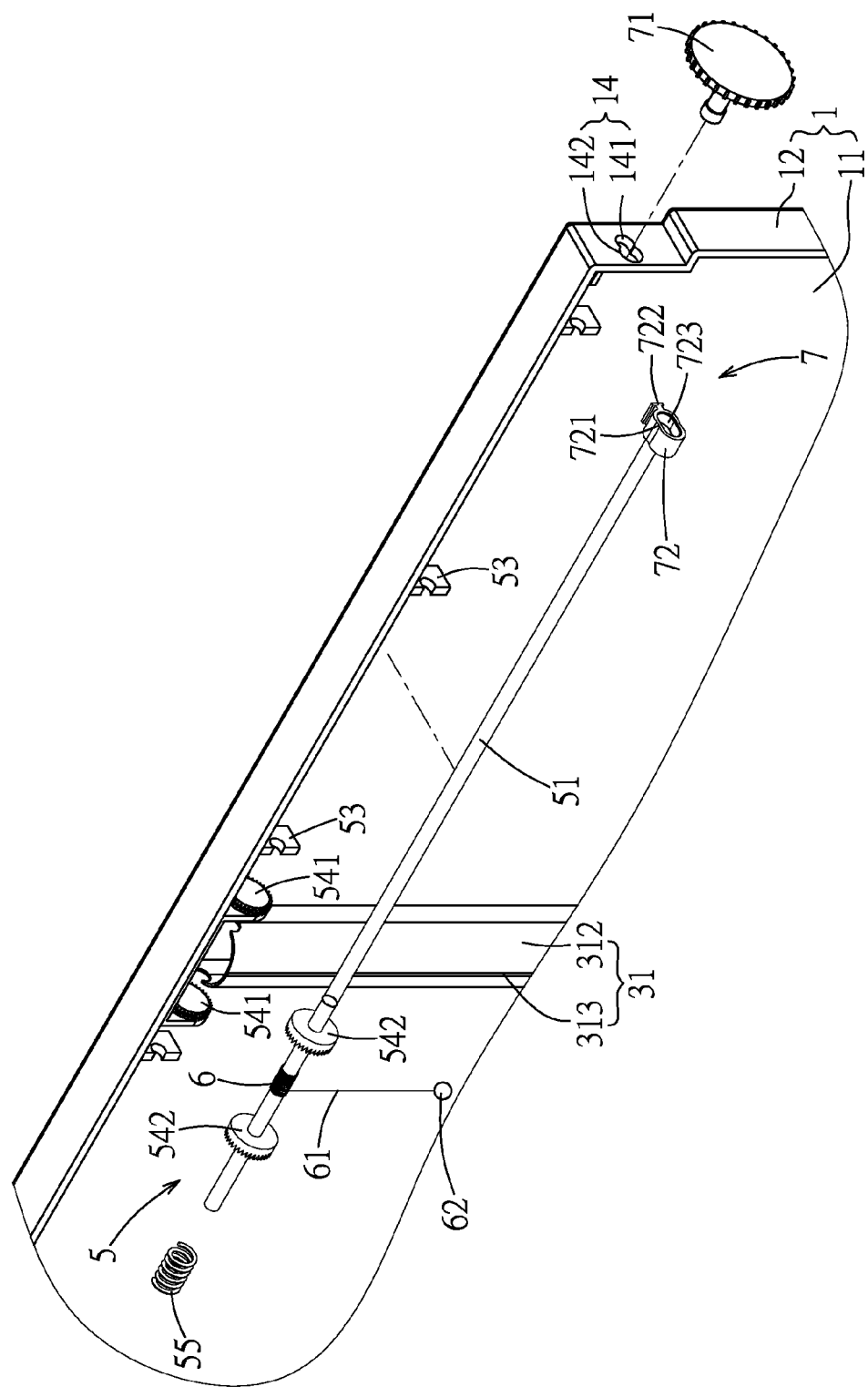
FIG. 7 is an enlarged fragmentary view illustrating a winding mechanism, a wire member and a control mechanism shown in FIG. 6.

The support unit includes a connecting member 3 and a supporting member 4. The connecting member 3 is connected to the base wall 11 and has a connect ion portion 34 corresponding in position to the opening 13. As a non-limiting disclosure, the connecting member 3 further has a mounting seat 31, a pivot seat 32 and a connecting rod 33. The mounting seat 31 is disposed on the inner side of the base wall 11 and covers the opening 13 (see FIG. 6). In this disclosure, the mounting seat 31 has a connecting wall 311 that contacts the base wall 11 and an arched wall 312 that is connected face to face to the connecting wall 311 to form a tubular body with the connecting wall 311 and that extends beyond the connecting wall 311 to cover the opening 13. The pivot seat 32 has a seat body 321 and a pivot pin 322 projecting from two opposite sides of the seat body 321. The pivot pin 322 is inserted rotatably into the arched wall 312 such that the pivot seat 32 is pivotally connected to the mounting seat 31. The connecting rod 33 is connected rotatably to the pivot seat 32 and has an end portion serving as the connection portion 34. The connecting rod 33 is pivotable relative to the base wall 11 by means of the pivot seat 32 and is able to extend out of the opening 13 to protrude from the base wall 11 and to rotate about its own axis. The supporting member 4 has an engaging piece 41 connected to the connection portion 34, a propping rod 42 extending outwardly of the opening 13 from the engaging piece 41, a first wire fixing part 44 connected to one end of the propping rod 42 and distal from the engaging piece 41, and a wire channel 43 formed in the propping rod 42 in a longitudinal direction of the propping rod 42 and extending from the engaging piece 41 to the first wire fixing part 44. The wire channel 43 cuts through a ball of the engaging piece 41 (details will be described hereinafter). Specifically, the supporting member 4 is pivotable relative to the base wall 11 through a connection of the connection portion 34 and the engaging piece 41 to vary an included angle (A) between the supporting member 4 and the base wall 11. In this disclosure, the connection portion 34 has a socket, and the engaging piece 41 has the ball. The connection portion 34 and the engaging piece 41 cooperatively form a ball-and-socket joint. In addition, the connection portion 34 and the engaging piece 41 are removably connected to each other such that the supporting member 4 is removably connected to the connecting member 3. In other words, the supporting member 4 is removable when not being used for convenience in packaging or storage. As a non-limiting arrangement, the end of the propping rod 42 distal from the engaging piece 41 is in the form of a fishtail that is gradually enlarged to expand outward for forming an elongate contacting surface that provides an increased stability. The first wire fixing part 44 is disposed on an end face of the fishtail.

Figure 10:
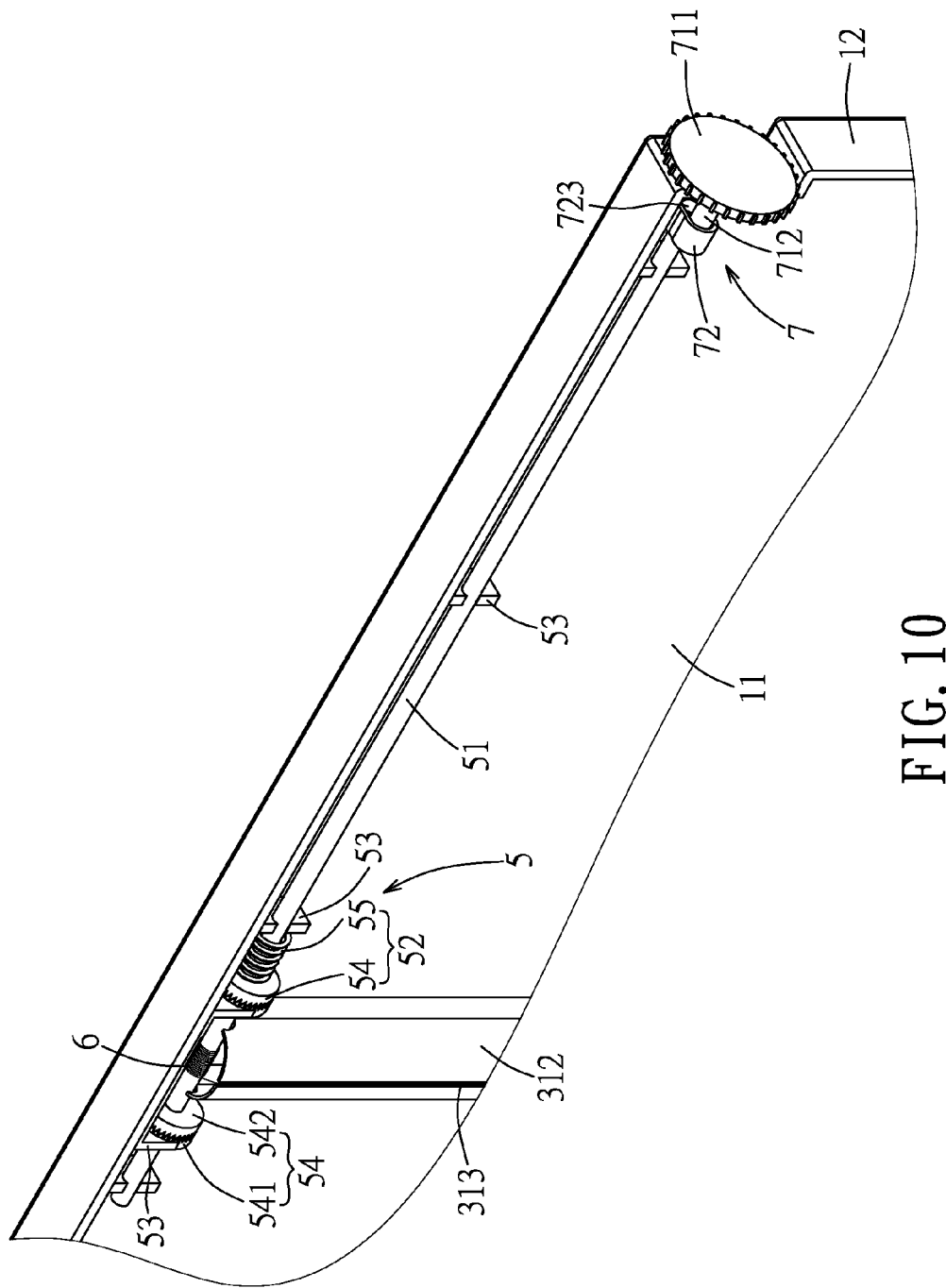
FIG. 10 is a fragmentary perspective view of the embodiment illustrating a winding shaft of the winding mechanism in a locked position.
Figure 11:
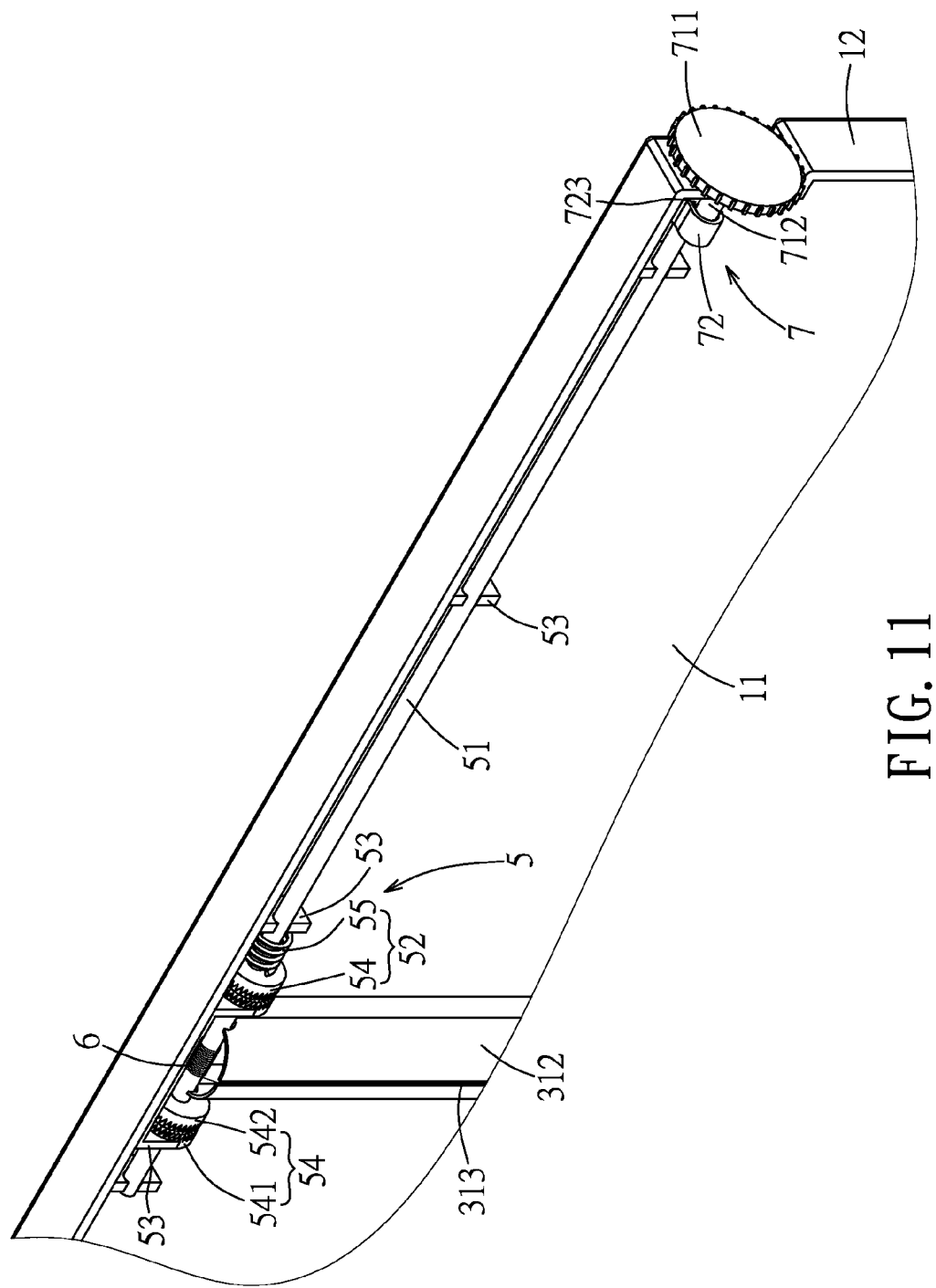
FIG. 11 is the same view as FIG. 10 but illustrating the winding shaft of the winding mechanism in an unlocked position.

Referring to FIGS. 6 to 10, the control wire unit includes a winding mechanism 5, a wire member 6 and a control mechanism 7. The winding mechanism 5 is disposed on an inner side of the base wall 11, and has a winding shaft 51 that is rotatable relative to the base wall 11, a shaft-limiting unit 52 that is connected to the winding shaft 51 to limit the winding shaft 51 so that the winding shaft 51 is able to be limited to a locked position or an unlocked position, and a plurality of shaft mounts 53 that protrude from the base wall 11 and that hold the winding shaft 51. The shaft-limiting unit 52 has two gear sets 54 and a resilient member 55. The winding shaft 51 coaxially extends through the gear sets 54. Each of the gear sets 54 has a stationary gear 541 and a displacement gear 542 separably and coaxially meshed with the stationary gear 541. The stationary gear 541 is stationarily mounted to a corresponding one of the shaft mounts 53. The displacement gear 542 is rotatable concomitantly with the winding shaft 51. The winding shaft 51 is controlled to move between the locked position (as shown in FIG. 10) where the displacement gear 542 meshes with the stationary gear 541 and the unlocked position (as shown in FIG. 11) where the displacement gear 542 separates from the stationary gear 541. The resilient member 55 is sleeved on the winding shaft 51 and abuts against the displacement gear 542 of a corresponding one of the gear sets 54 so that the resilient member 55 urges the winding shaft 51 to move to the locked position. While two gear sets 54 are used in this embodiment, using only one gear set 54 is also implementable.

Figure 1:
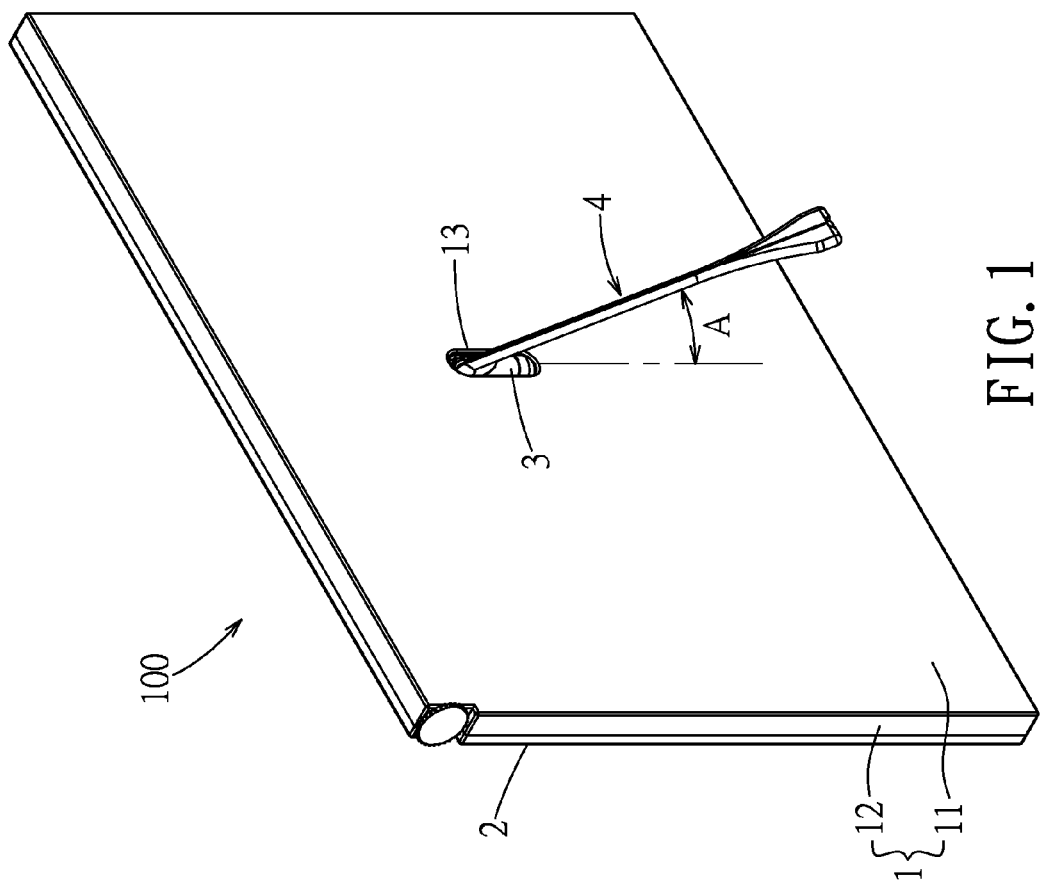
FIG. 1 is a perspective view illustrating the embodiment of an electronic device according to the present invention.
Figure 2:
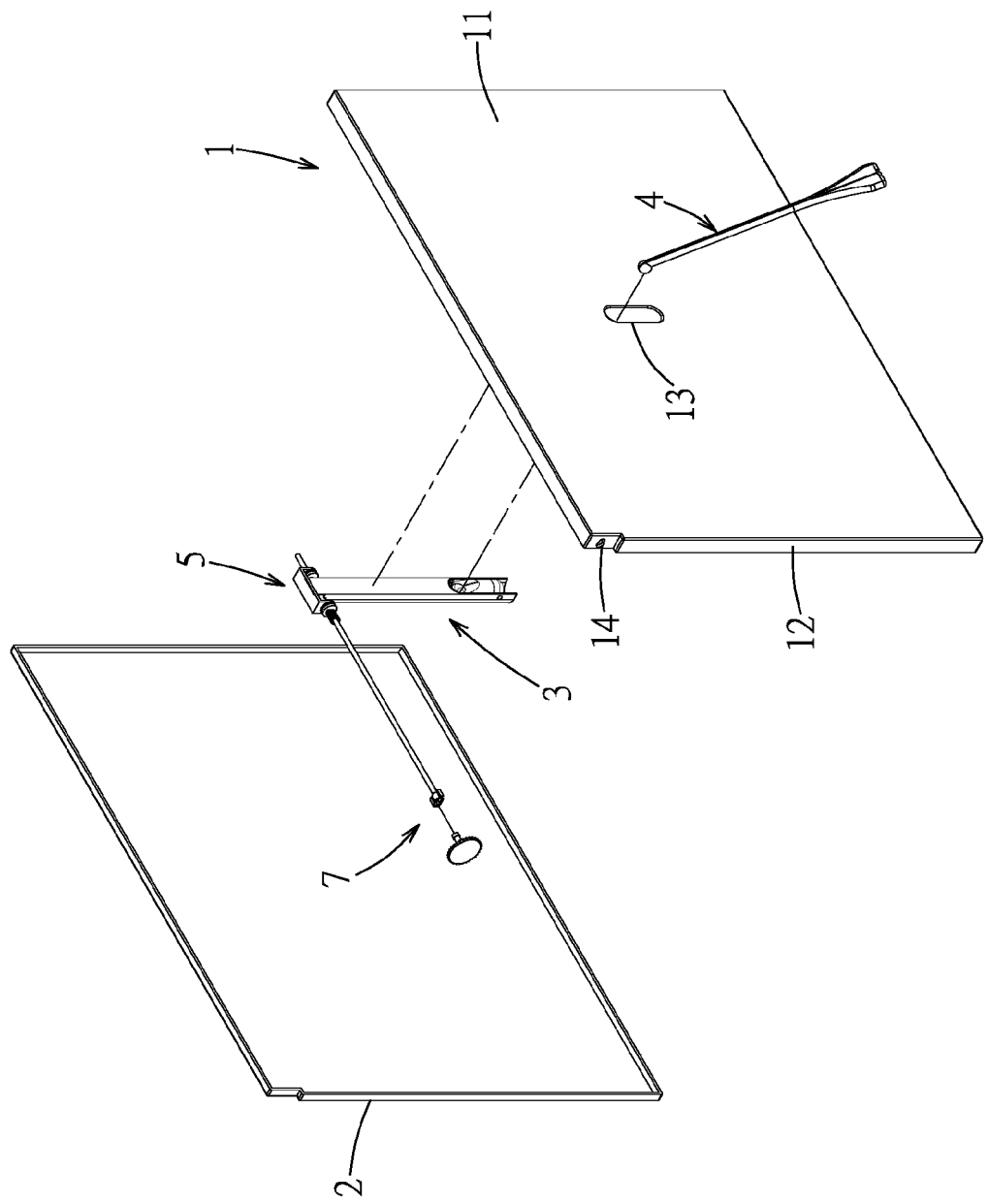
FIG. 2 is an exploded perspective view of the embodiment.
Figure 3:
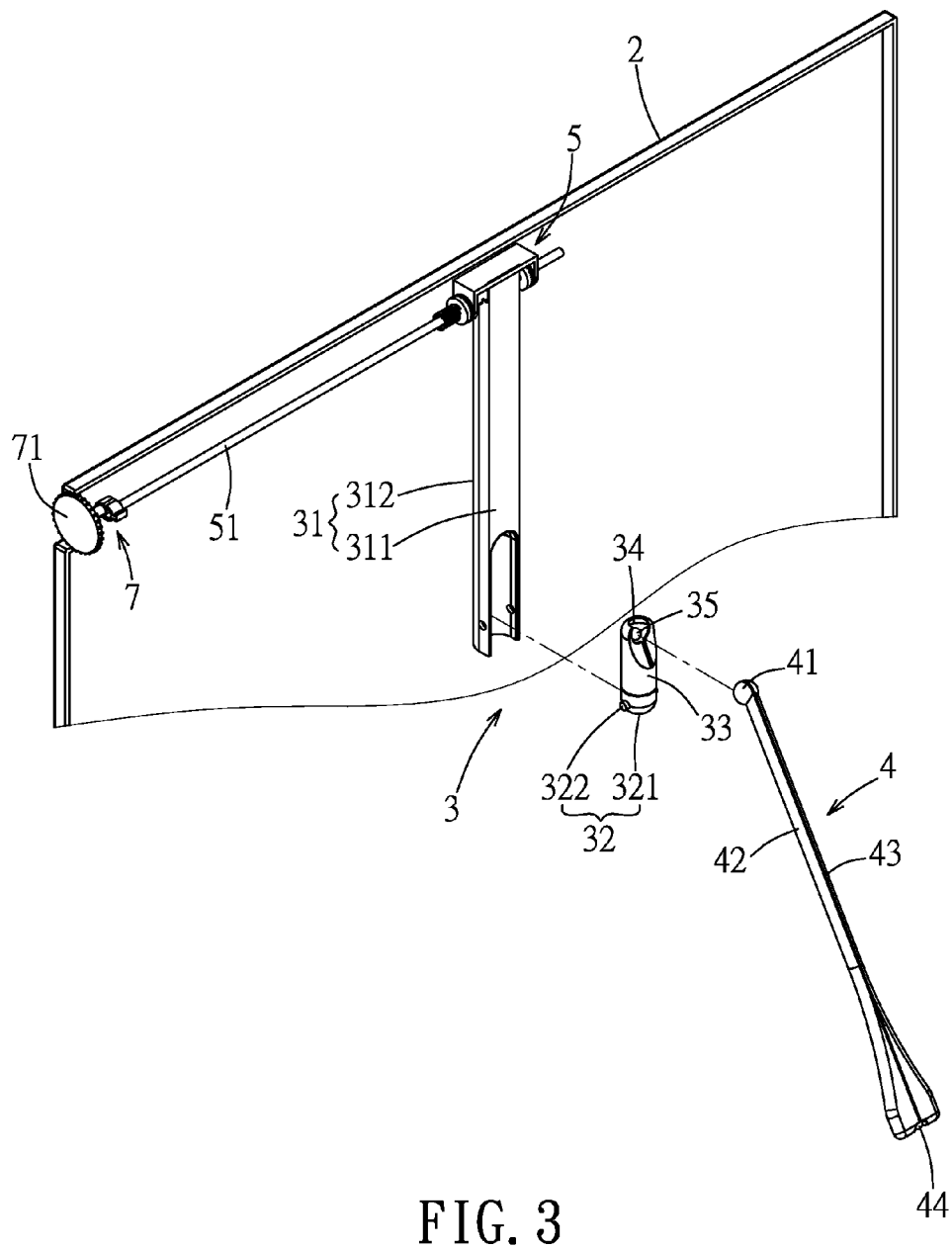
FIG. 3 is a fragmentary exploded perspective view illustrating the connection of a support unit to a housing of the embodiment.
Figure 4:
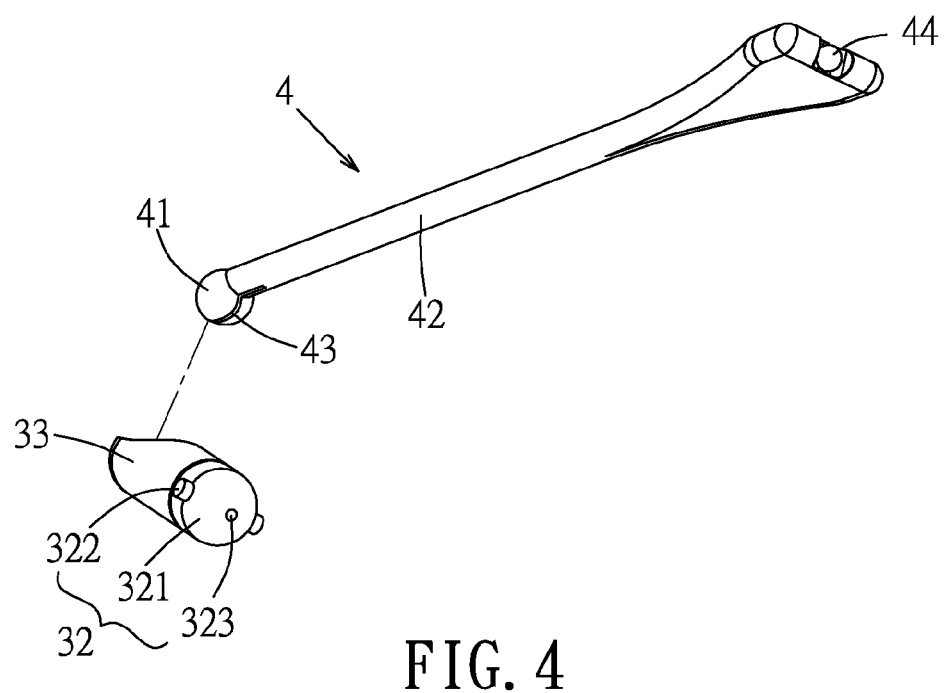
FIG. 4 is an exploded perspective view illustrating a supporting member and a connection member of the support unit.
Figure 5:
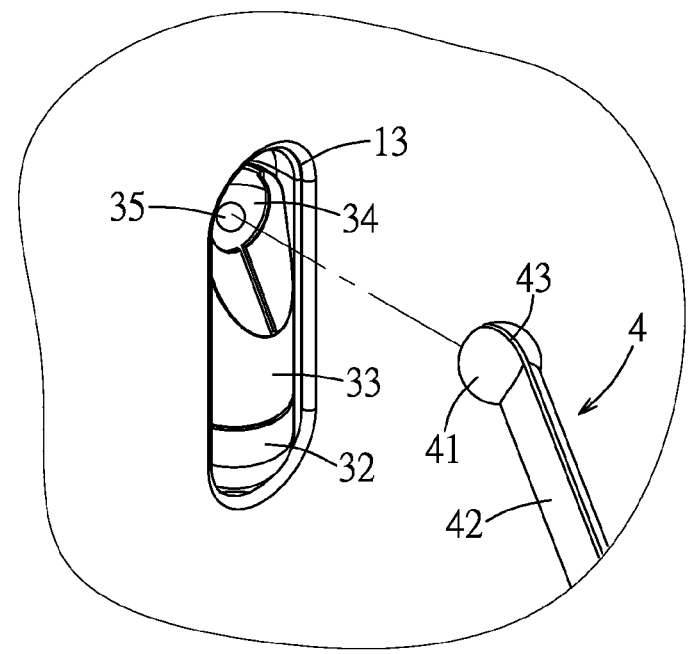
FIG. 5 is an enlarged fragmentary exploded perspective view illustrating in detail a part of the supporting member and a part of the connecting member.
Figure 14:
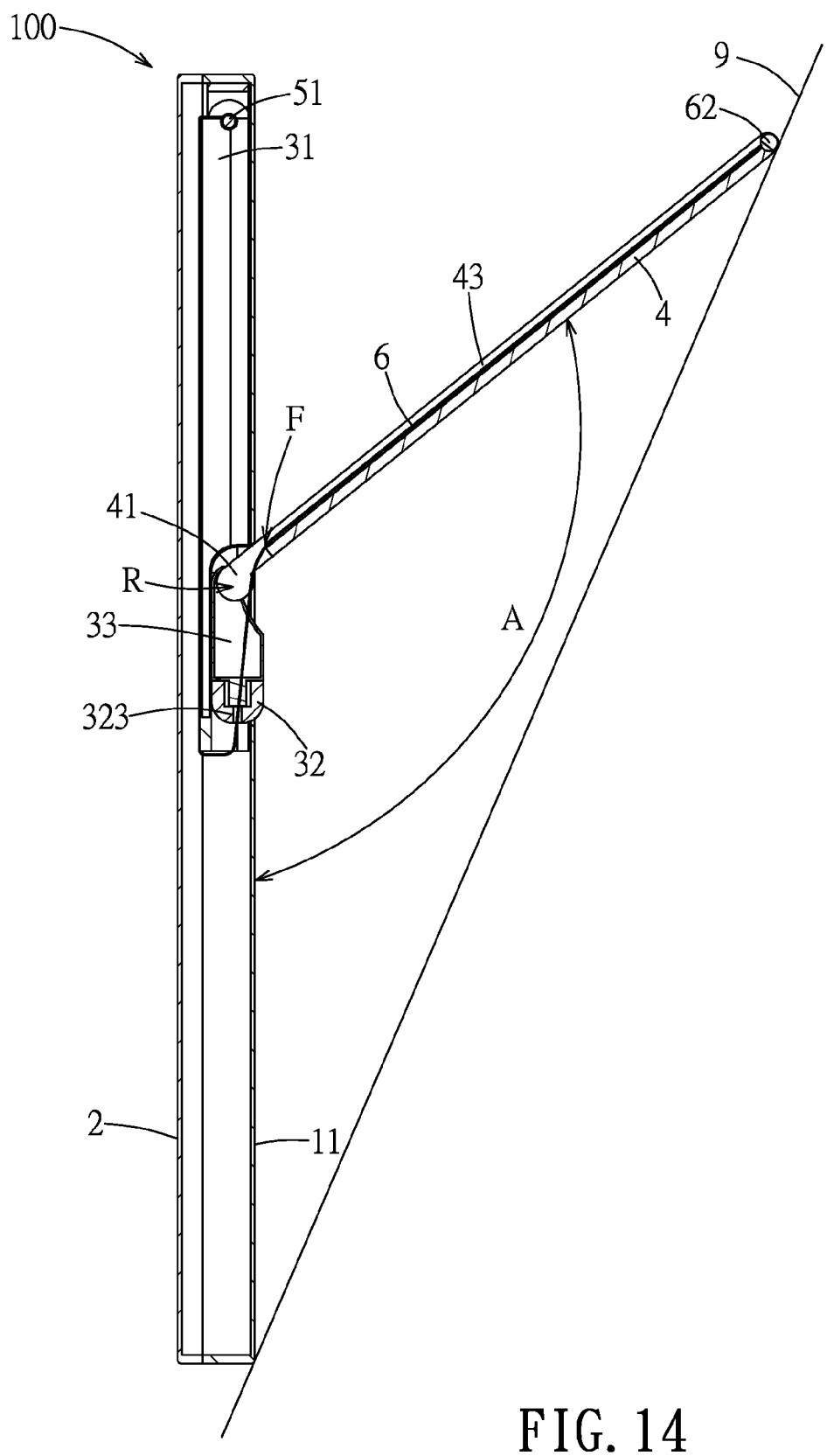
FIG. 14 is a sectional side view illustrating in detail a relationship between the control wire unit and the support unit.

The wire member 6 has a wire 61 and a positioning part 62 connected to the first wire fixing part 44. The wire 61 is wound on the winding shaft 51, and has one end secured to the winding shaft 51 and another end connected to the positioning part 62. The mounting seat 31 extends in a direction transverse to the winding shaft 51. The connecting wall 311 (see FIG. 3) is elongated between the winding shaft 51 and the opening 13. The mounting seat 31 further has a wire guide groove 313 that is formed in the arched wall 312 and that extends in the direction transverse to the winding shaft 51. With further reference to FIG. 14, the wire member 6 is disposed along the wire guide groove 313 of the moving seat 31 from the winding shaft 51, and passes through the pivot seat 32 and the connecting rod 33, from where, the wire member 6 further extends through the connection portion 34 and the opening 13 (as shown in FIG. 5) to the wire channel 43 until the positioning part 62 is secured to the first wire fixing part 44. By virtue of the two ends of the wire 61 respectively secured to the winding shaft 51 and the first wire fixing part 44, the wire 61 is stretched. Namely, a part of the wire 61 is stretchedly received in the wire guide groove 313, and another part of the wire 61 is stretchedly received in the wire channel 43 so that the wire member 6 is confined therewithin. In this embodiment, the positioning part 62 is in the form of a bead. The first wire fixing part 44 is in the form of a bead-shaped groove for positioning and receiving the positioning part 62. The pivot seat 32 further has a through hole 323 (as shown in FIG. 4) that extends through the seat body 321 such that the wire 61 is capable of extending through the through hole 323. In addition, the connecting member 3 further has a second wire fixing part 35 proximate to the connection portion 34. Specifically, the second wire fixing part 35 is in the form of a bead-shaped groove that is formed in the connecting rod 33 and that has a configuration similar to the first wire fixing part 44. As such, the second wire fixing part 35 secures the positioning part 62 when the supporting member 4 is removed from the connecting member 3.

With reference to FIGS. 7 to 13, the control mechanism 7 is connected to the winding mechanism 5 and has a control member 71 disposed on the side wall 12 to be operated by a user. In this embodiment, the winding shaft 51 is controlled by the control member 71 to move between the locked position and the unlocked position. The control mechanism 7 further has an operator connector 72 connected to an end portion of the winding shaft 51. The control member 71 has an operator wheel 711 disposed outwardly on the side wall 12, and a connecting bar 712 connected to the operator wheel 711 and extending through the restricting hole 14. The connecting bar 712 has a root portion 7121 connected to the operator wheel 711, a head portion 7122 disposed away from the operator wheel 711, and a main bar section 7123 interconnecting and being smaller in cross-section than the root portion 7121 and the head portion 7122. In this embodiment, the operator connector 72 has a main body 721, a slide block 722 protruding outwardly from the main body 721, and a restricting groove 723 formed in the main body 721 in alignment with the restricting hole 14. The control mechanism 7 further has a pair of slide rails 73 mounted on the base wall 11. The slide block 722 of the operator connector 72 is slidably received in and disposed between the slide rails 73. By virtue of the slide rails 73 holding the slide block 722, the slide block 722 is restricted from moving in a direction transverse to the winding shaft 51. The end portion of the winding shaft 51 has an end surface 511 that is disposed in the restricting groove 723 and that is aligned with the small-hole portion 141 of the restricting hole 14. The winding shaft 51 has a shaft toothed portion 512 that is disposed on the end surface 511 and that is along an axis of the winding shaft 51. In this embodiment, the connecting bar 712 further has a bar toothed portion 7124 that is disposed on the head portion 7122 and that is along an axis of the connecting bar 712. The root portion 7121 has a diameter smaller than that of the large-hole portion 142 of the restricting hole 14 and greater than that of the small-hole portion 141. The main bar section 7123 has a diameter smaller than that of the small-hole portion 141. The head portion 7122 is received in the restricting groove 723 and is slidable along a direction perpendicular to the base wall 11.

Figure 12:
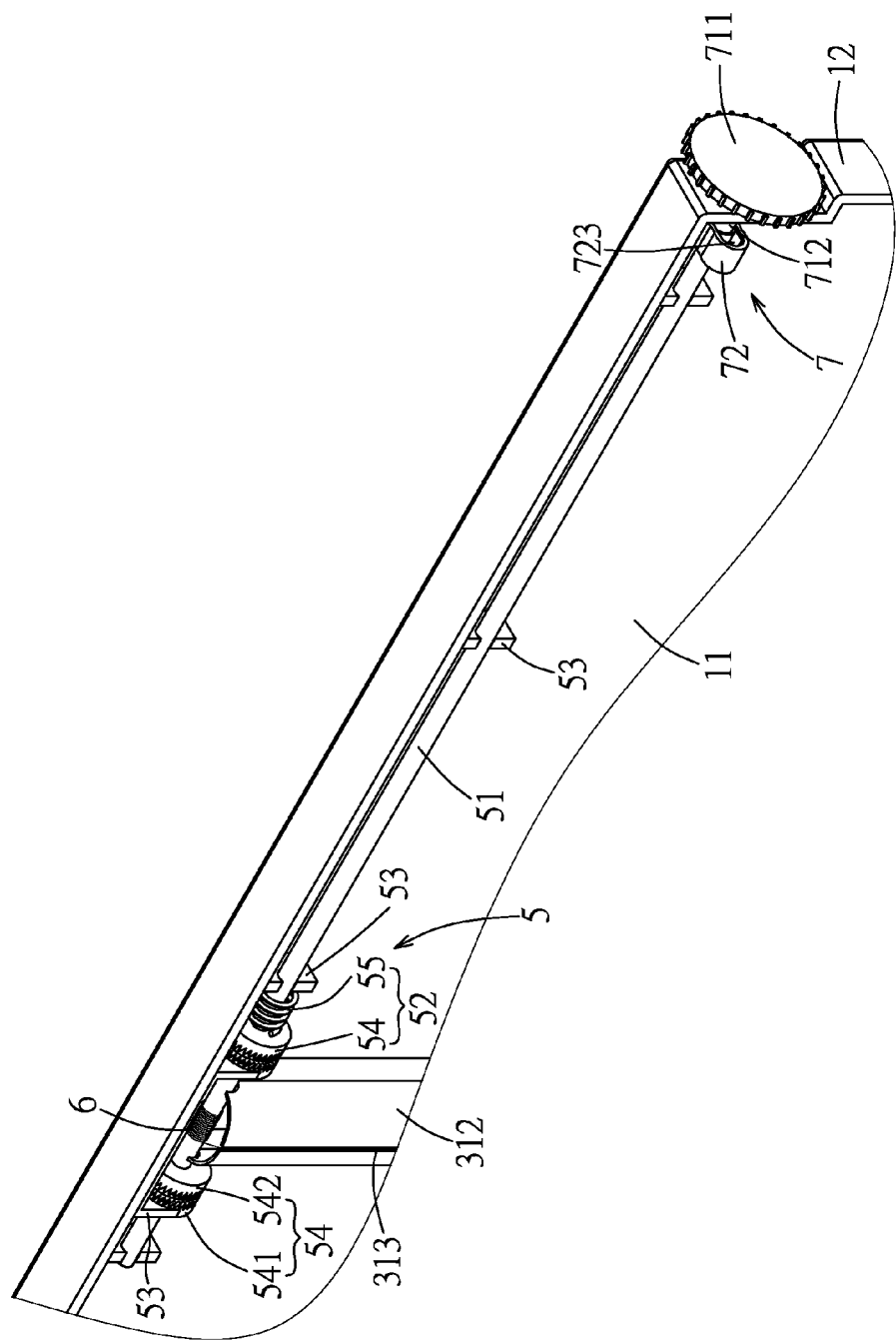
FIG. 12 is the same view as FIG. 11 but illustrating an operator wheel of the control mechanism that is operating when the winding shaft is in the unlocked position.
Figure 13:
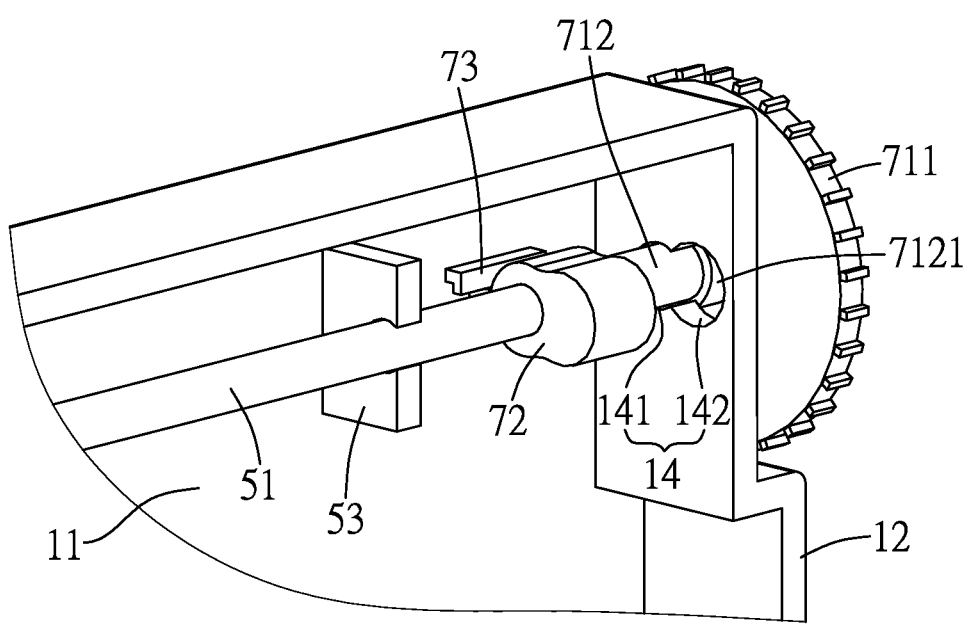
FIG. 13 is a fragmentary perspective view of the embodiment illustrating a relationship between the control mechanism and the housing while the winding shaft of the winding mechanism is in the unlocked position.

The control member 71 is operable to control the winding mechanism 5 so as to adjust a length of an unwound part of the wire member 6 for control of the included angle (A) between the supporting member 4 and the base wall 11. As shown in FIG. 10, the operator wheel 711 is operable to move the connecting bar 712 into the large-hole portion 142 (see FIG. 8) so that the winding shaft 51 is in the locked position. In other words, when the connecting bar 712 is disposed in the large-hole portion 142, the root portion 7121 (see FIG. 9) of the connecting bar 712 is disposed in the large-hole portion 142, and the displacement gears 542 of the gear sets 54 mesh with the respective stationary gears 541. Accordingly, the winding shaft 51 is in the locked position and is nonrotatable. The locked position is a normal position, which prevents unwinding of the wire 61 wound on the winding shaft 51. In this locked position, the connecting bar 712 and the winding shaft 51 are staggered with each other, that is to say, the connecting bar 712 and the winding shaft 51 are not coaxial with each other. When the length of the unwound part of the wire member 6 is required to be adjusted by rotating the winding shaft 51, as shown in FIG. 11, the operator wheel 711 is pulled outward to move the root portion 7121 of the connecting bar 712 out of the side wall 12 through the large-hole portion 142 (see FIG. 13), and to move the head portion 7122 of the connecting bar 712 together with the operator connector 72, which in turn moves the winding shaft 51 to move toward the restricting hole 14 of the side wall 12. In such a manner, the displacement gears 542 separate from the respective stationary gears 541, thereby placing the winding shaft 51 in the unlocked position, where the winding shaft 51 is rotatable. As shown in FIGS. 12 and 13, the operator wheel 711 is operated further to further move the main bar section 7123 of the connecting bar 712 (see FIG. 9) to the small-hole portion 141 until the root portion 7121 is positioned outside of the small-hole portion 141. That is to say, when the root portion 7121 is disposed outward of the side wall 12, the winding shaft 51 is placed in the unlocked position. As the connecting bar 712 is moved into the small-hole portion 141, the head portion 7122 slides in the restricting groove 723 to confront with the end surface 511 of the winding shaft 51 so that the bar toothed portion 7124 of the connecting bar 712 is engaged with the shaft toothed portion 512 of the winding shaft 51 (see FIG. 9). As such, the connecting bar 712 and the winding shaft 51 are coaxial with each other to permit the operator wheel 711 to rotate the winding shaft 51 for winding or unwinding the wire member 6. In addition, moving the winding shaft 51 toward the restricting hole 14 in the side wall 12 can compress the resilient member 55. In this embodiment, the resilient member 55 is a compression spring. The resilient member 55 when compressed has a restoring force to return the operator wheel 711 to its original position. In other words, when the connecting bar 712 is in the large-hole portion 142, since the diameter of the root portion 7121 of the connecting bar 712 is smaller than that of the large-hole portion 142, the root portion 7121 is not restrained by the side wall 12 and is allowed to retract into the large-hole portion 142. By virtue of the restoring force of the resilient member 55, the winding shaft 51 is automatically returned to the locked position, thereby bringing the operator connector 72 and the control member 71 to return to their original positions once the user stops operating the control member 71.

Figure 15:
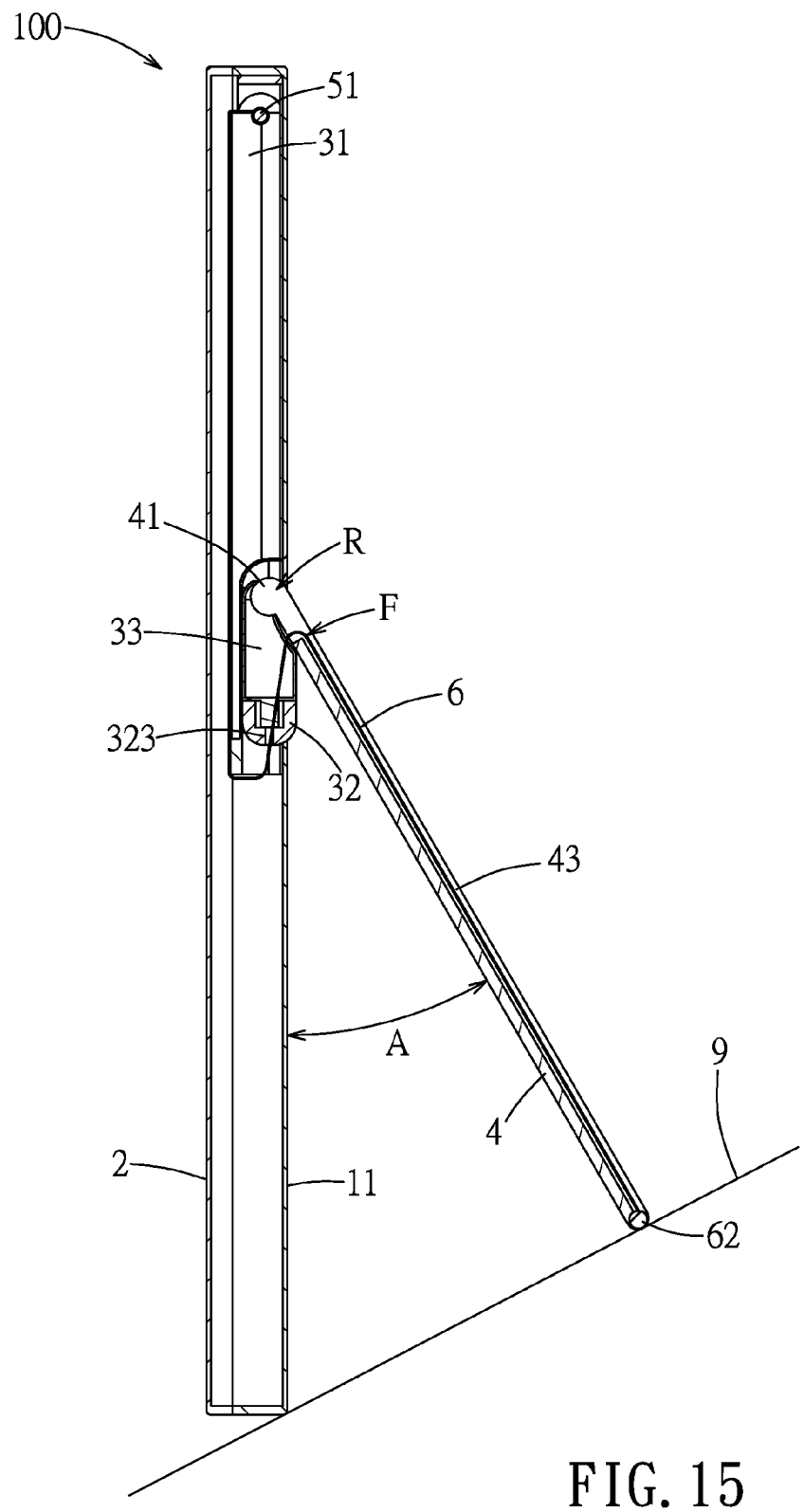
FIG. 15 is a sectional side view similar to FIG. 14, but illustrating an included angle between the supporting member and the housing that is reduced when the winding shaft is rotated in a winding direction to wind the wire member.
Figure 16:
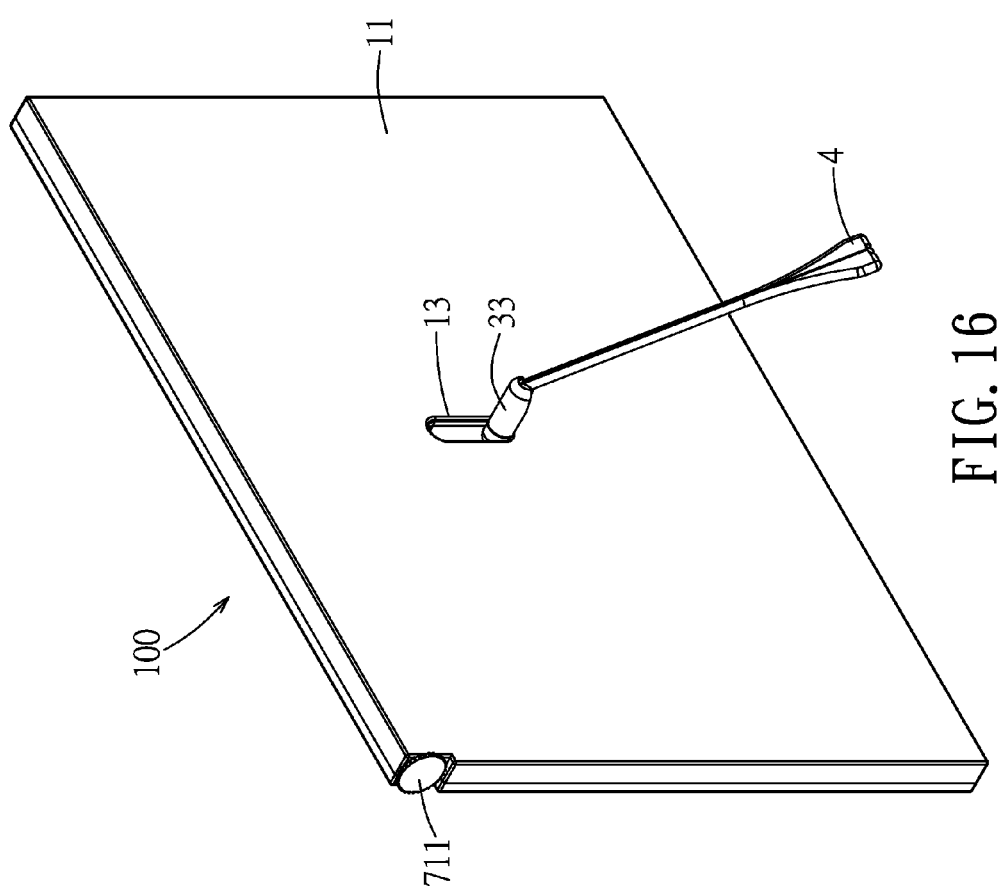
FIG. 16 is a perspective view of the embodiment illustrating a different supporting mode of the support unit.
Figure 17:
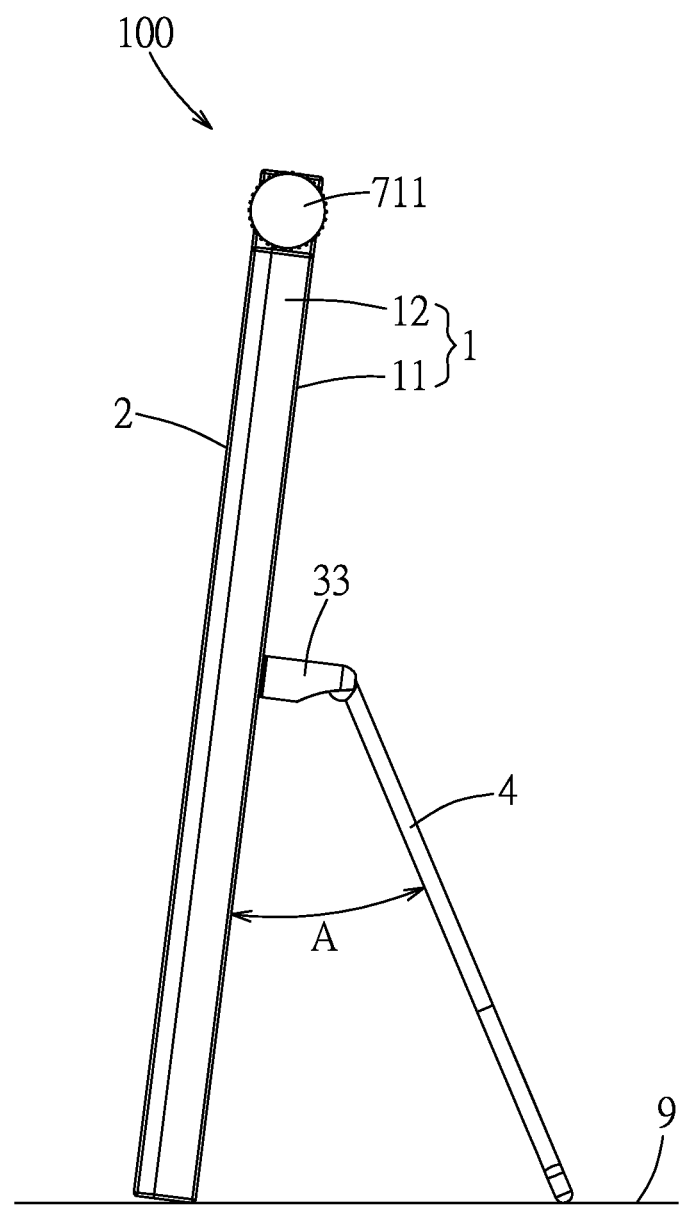
FIGS. 17 and 18 are side views illustrating different included angles formed between the housing and the supporting member during the supporting mode shown in FIG. 16.
Figure 18:
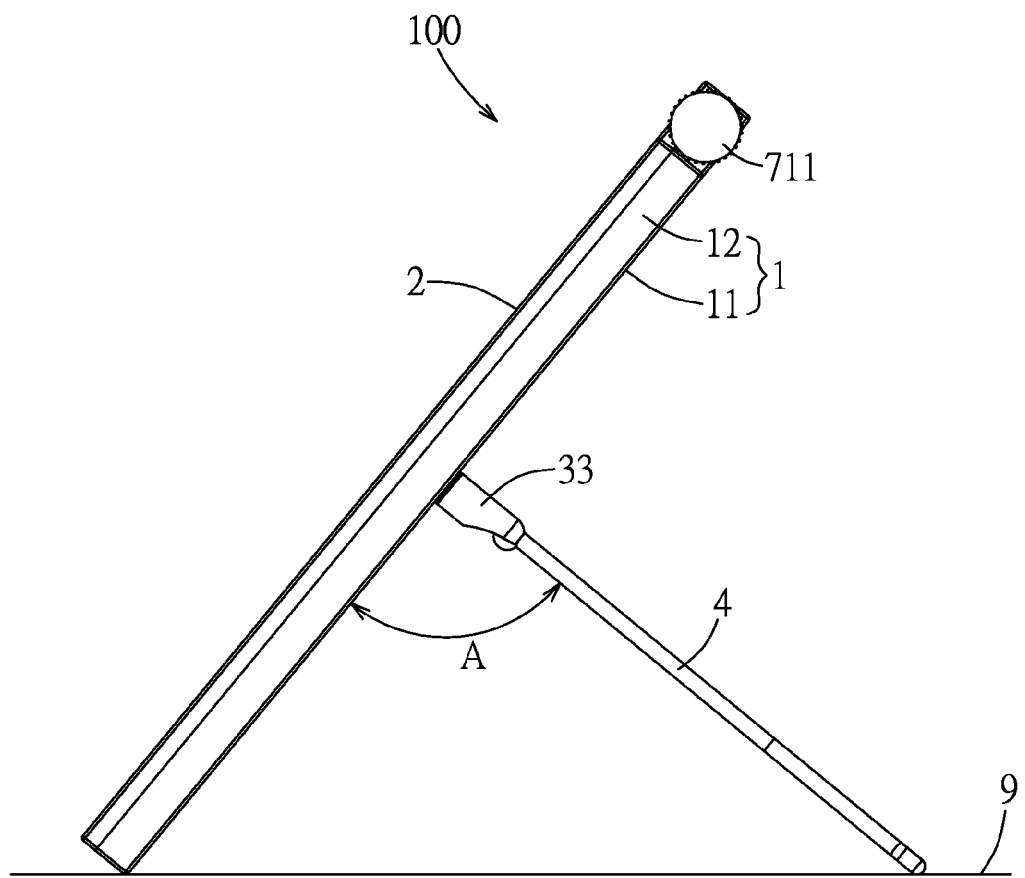

The included angle (A) (see FIG. 14) between the supporting member 4 and the base wall 11 is controlled by adjusting the length of the part of the wire 61 unwound from the winding shaft 51. More details are describes below. Referring to FIGS. 14 and 15, when the electronic device 100 is disposed on a surface 9, such as a desk surface, gravity affects the electronic device 100 such that the supporting member 4 has a tendency to rotate counterclockwise away from the base wall 11. Therefore, a clockwise pulling force is needed to hold the supporting member 4 for counterbalancing gravity. As shown in FIG. 14, the wire member 6 is disposed along the wire channel 43 of the supporting member 4, and the positioning part 62 of the wire member 6 is secured to the wire fixing part 44 (see FIG. 3). Furthermore, since the wire channel 43 cuts through the engaging piece 41, a force-applying point (F) on the supporting member 4 by the wire member 6 does not coincide with a pivoting point (R) of the supporting member 4. As shown in FIG. 15, reduction of a length of the wire 61 (see FIG. 7) unwound from the winding shaft 51 produces a clockwise pulling force for moving the support member 4 toward the base wall 11. In other words, the includes angle (A) is reduced between the supporting member 4 and the base wall 11, such that the electronic device 100 can stand more upright relative to the surface 9. Conversely, if the included angle (A) between the supporting member 4 and the base wall 11 is to be enlarged, the unwound length of the wire 61 may be lengthened to place the electronic device 100 in a position nearly lying on the surface 9. Referring to FIGS. 16 to 18, the connecting rod 33 of the connecting member 3 may be pulled outward from the base wall 11 for pivoting the supporting member 4.

Figure 19:
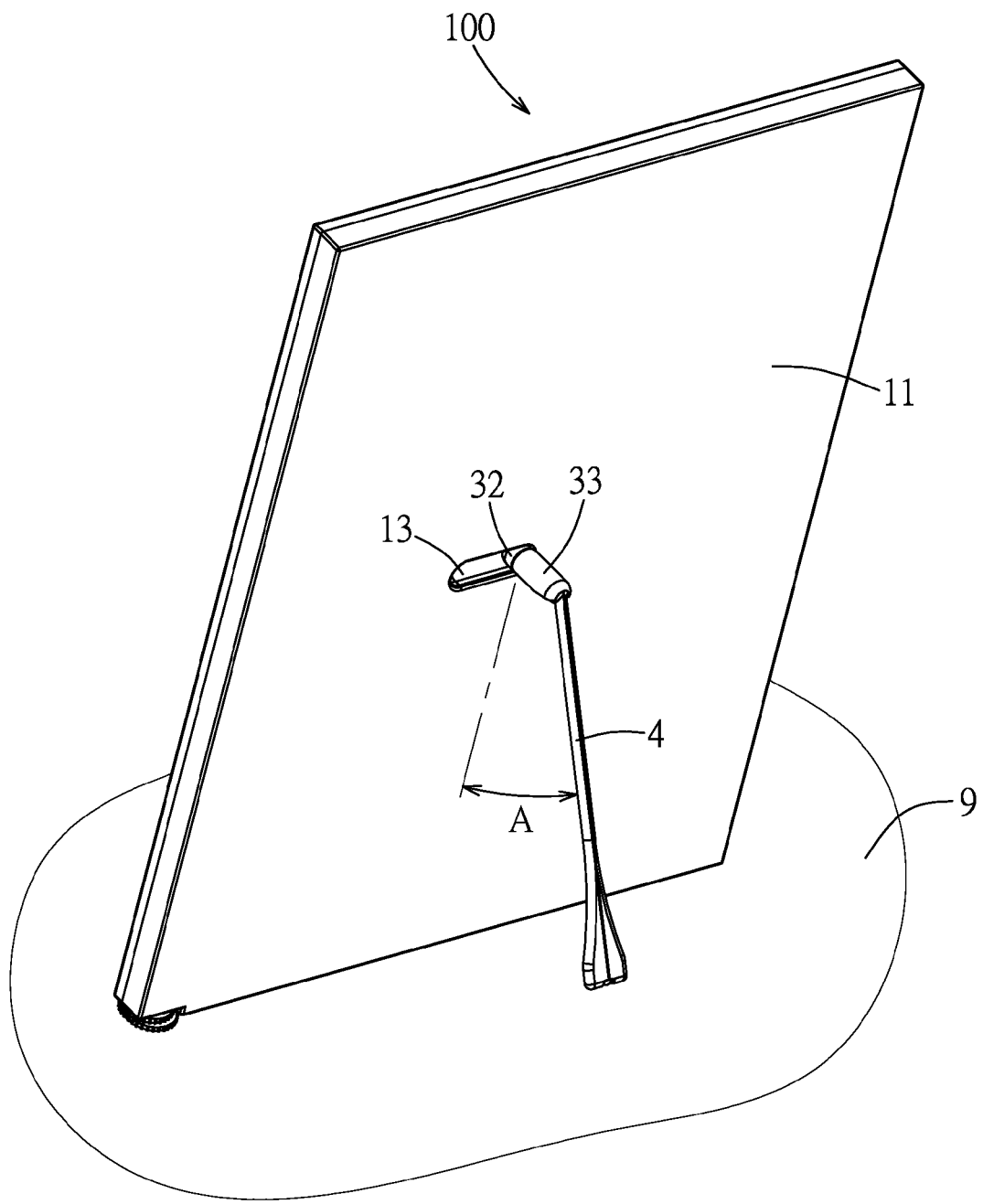
FIG. 19 is a perspective view illustrating another different supporting mode of the support unit.

Referring to FIG. 19, when the electronic device 100 is rotated about 90 degrees on the surface 9, the connecting rod 33 may be pulled outward from the base wall 11 and be rotated about 90 degrees together with the supporting member 4, such that the supporting member 4 abuts against the surface 9 to support the electronic device 100 on the surface 9. Similarly, the control wire unit is used to adjust the included angle (A) between the supporting member 4 and the base wall 11. In other words, by virtue of the supporting member 4, the display screen 2 (see FIG. 2) of the electronic device 100 can be disposed horizontally or vertically relative to the surface 9.

Figure 20:
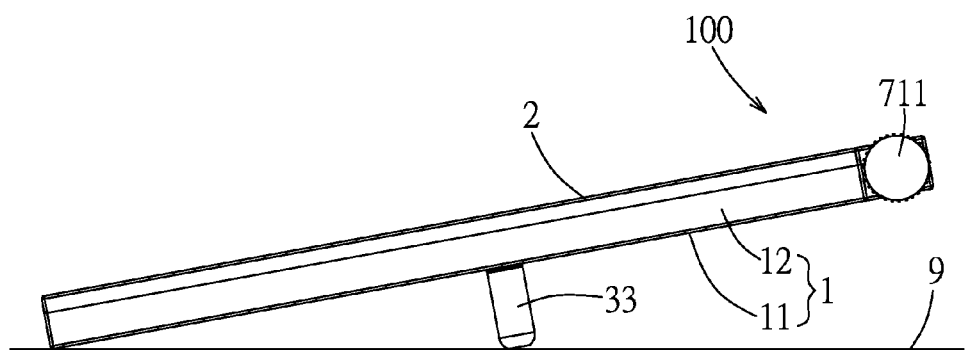
FIG. 20 is a side view illustrating still another different supporting mode of the support unit.

Referring to FIG. 20, the electronic device 100 can be supported by using the connecting member 3 alone. When the supporting member 4 (see FIG. 1) is disassembled from the connecting member 3, the connecting rod 33 may be pulled outward from the base wall 11 and placed in abutment with the surface 9. In this position, the display screen 2 of the electronic device 100 is slightly inclined relative to the surface 9 and is operable for a different application mode.

When the electronic device 100 is not in use, the supporting member 4 may be removed therefrom, and the connecting rod 33 may be put into the base wall 11. As such, the electronic device 100 may be conveniently packaged, stored, transported or carried.

To sum up, the support unit and the control wire unit of the electronic device 100 according to the present invention are operable to provide various supporting modes for meeting different demands in application. Further, the support unit and the control wire unit has a reduced weight because of the lightweight structures thereof. In addition, the base wall 11 of the housing 1 may have a flat outer surface since the supporting member 4 is removable, and the supporting member 4 is substantially flat. Therefore, it is convenient to package, store, transport and carry the electronic device 100.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. An electronic device, comprising:
   a housing including a base wall and a side wall transversely connected to said base wall, said base wall having an opening;
   a support unit including a connecting member and a supporting member,
      said connecting member being connected to said base wall and having a connection portion that corresponds in position to said opening,
      said supporting member having an engaging piece that is connected to said connection portion, a propping rod that extends outwardly of said opening from said engaging piece, a first wire fixing part that is connected to one end of said propping rod and distal from said engaging piece, and a wire channel that is formed in said propping rod in a longitudinal direction of said propping rod and that extends from said engaging piece to said first wire fixing part, said supporting member being pivotable relative to said base wall through a connection of said connection portion and said engaging piece to vary an included angle between said supporting member and said base wall; and
   a control wire unit including a winding mechanism, a wire member and a control mechanism,
      said winding mechanism being disposed on an inner side of said base wall, and having a winding shaft that is rotatable relative to said base wall and a shaft-limiting unit that is connected to said winding shaft for limiting said winding shaft,
      said wire member having a wire and a positioning part connected to said first wire fixing part, said wire being wound on said winding shaft, and having one end secured to said winding shaft and another end connected to said positioning part, said wire member extending through said connection portion and said opening to enable said positioning part to be secured to said first wire fixing part so that part of said wire is received stretchedly within said wire channel,
      said control mechanism being connected to said winding mechanism and having a control member disposed on said side wall to be operated by a user, said control member being operable to control said winding mechanism so as to adjust a length of an unwound part of said wire member for control of a pivoting movement of said supporting member and the included angle between said supporting member and said base wall.

2. The electronic device as claimed in claim 1, wherein said supporting member is removably connected to said connecting member, said connecting member further having a second wire fixing part proximate to said connection portion, said second wire fixing part securing said positioning part when said supporting member is removed from said connecting member.

3. The electronic device as claimed in claim 1, wherein said connecting member further has a mounting seat, a pivot seat and a connecting rod, said mounting seat being disposed on said inner side of said base wall and covering said opening, said pivot seat being pivotally connected to said mounting seat, said connecting rod being connected rotatably to said pivot seat and having an end portion that serves as said connection portion, said connecting rod being pivotable relative to said base wall by means of said pivot seat and being able to extend out of said opening to protrude from said base wall and to rotate about its own axis.

4. The electronic device as claimed in claim 3, wherein said mounting seat extends in a direction transverse to said winding shaft, and has a connecting wall that contacts said base wall and that is elongated between said winding shaft and said opening, an arched wall that is connected face to face to said connecting wall to form a tubular body with said connecting wall and that extends beyond said connecting wall to cover said opening, and a wire guide groove that is formed in said arched wall and that extends in the direction transverse to said winding shaft, said pivot seat having a seat body and a pivot pin that projects from two opposite sides of said seat body, said pivot pin being inserted rotatably into said arched wall, part of said wire being stretchedly received in said wire guide groove.

5. The electronic device as claimed in claim 1, wherein:
   said connection portion has a socket,
   said engaging piece has a ball, and
   said connection portion and said engaging piece cooperatively form a ball-and-socket joint.

6. The electronic device as claimed in claim 5, wherein said wire channel cuts through said ball of said engaging piece.

7. The electronic device as claimed in claim 1, wherein said winding mechanism further has a plurality of shaft mounts that protrude from said base wall and that hold said winding shaft, said shaft-limiting unit having a gear set through which said winding shaft coaxially extends, said gear set having a stationary gear and a displacement gear separably and coaxially meshed with said stationary gear, said stationary gear being stationarily mounted to one of said shaft mounts, said displacement gear being rotatable concomitantly with said winding shaft, said winding shaft being controlled by said control member to move between a locked position where said displacement gear meshes with said stationary gear and an unlocked position where said displacement gear separates from said stationary gear.

8. The electronic device as claimed in claim 7, wherein said shaft-limiting unit further has a resilient member sleeved on said winding shaft, said resilient member urging said winding shaft to move to the locked position.

9. The electronic device as claimed in claim 7, wherein said side wall has a restricting hole extending therethrough, said restricting hole having a small-hole portion and a large-hole portion that is larger than and juxtaposed in communication with said small-hole portion along a direction perpendicular to said base wall, said control mechanism further having an operator connector connected to an end portion of said winding shaft, said operator connector having a restricting groove aligned with said restricting hole, said end portion of said winding shaft having an end surface that is disposed in said restricting groove and that is aligned with said small-hole portion, said winding shaft having a shaft toothed portion that is disposed on said end surface and that is along an axis of said winding shaft, said control member having an operator wheel that is disposed outwardly on said side wall and a connecting bar that extends from said operator wheel through said restricting hole, said connecting bar having a root portion that is connected to said operator wheel, a head portion that is disposed away from said operator wheel, a main bar section that interconnects and is smaller in cross-section than said root portion and said head portion, and a bar toothed portion that is disposed on said head portion and that is along an axis of said connecting bar, said root portion having a diameter smaller than that of said large-hole portion and greater than that of said small-hole portion, said main bar section having a diameter smaller than that of said small-hole portion, said head portion being received and being slidable along a direction perpendicular to said base wall in said restricting groove, said operator wheel being operable to move said connecting bar into said large-hole portion so that said winding shaft is in the locked position, said operator wheel being pullable outward to move said root portion out of said side wall through said large-hole portion so that said winding shaft is in the unlocked position, and to further move said main bar section to said small-hole portion until said root portion is positioned outside of said small-hole portion so that said bar toothed portion is engaged with said shaft toothed portion to permit said operator wheel to rotate said winding shaft while said winding shaft is placed in the unlocked position.

10. The electronic device as claimed in claim 1, wherein said positioning part is in the form of a ball.

11. A wire controlled support assembly for an electronic device, comprising:
    a support unit including a connecting member and a supporting member,
        said connecting member having a connection portion, said supporting member having an engaging piece that is connected to said connection portion, a propping rod that extends from said engaging piece, a first wire fixing part that is connected to one end of said propping rod and distal from said engaging piece, and a wire channel that is formed in said propping rod in a longitudinal direction of said propping rod and that extends from said engaging piece to said first wire fixing part; and
    a wire control unit including a winding mechanism, a wire member and a control mechanism,
        said winding mechanism having a winding shaft and a shaft-limiting unit connected to said winding shaft for limiting said winding shaft,
        said wire member having a wire and a positioning part connected to said first wire fixing part, said wire being wound on said winding shaft, and having one end secured to said winding shaft and another end connected to said positioning part,
        said control mechanism being connected to said winding mechanism and having a control member to be operated by a user, said control member being operable to control said winding mechanism so as to adjust a length of an unwound part of said wire member.

12. The control wire assembly as claimed in claim 11, wherein said supporting member is removably connected to said connecting member, said connecting member further having a second wire fixing part proximate to said connection portion, said second wire fixing part securing said positioning part when said supporting member is removed from said connecting member.

13. The control wire assembly as claimed in claim 11, wherein said connecting member further has a mounting seat, a pivot seat and a connecting rod, said pivot seat being connected pivotally to said mounting seat, said connecting rod being connected to said pivot seat to rotate about its own axis and having an end portion serving as said connection portion.

14. The control wire assembly as claimed in claim 13, wherein said mounting seat has a connecting wall, an arched wall that is connected face to face to said connecting wall to form a tubular body with said connecting wall and that extends beyond said connecting wall, and a wire guide groove that is formed in said arched wall and that extends in the direction transverse to said winding shaft, said pivot seat having a seat body, and a pivot pin that projects from two opposite sides of said seat body, said pivot pin being inserted rotatably into said arched wall.

15. The control wire assembly as claimed in claim 11, wherein:
    said connection portion has a socket,
    said engaging piece has a ball, and
    said connection portion and said engaging piece cooperatively form a ball-and-socket joint.

16. The control wire assembly as claimed in claim 15, wherein said wire channel cuts through said ball of said engaging piece.

17. The control wire assembly as claimed in claim 11, wherein said winding mechanism further has a plurality of shaft mounts that hold said winding shaft, said shaft-limiting unit having a gear set through which said winding shaft coaxially extends, said gear set having a stationary gear and a displacement gear separably and coaxially meshed with said stationary gear, said stationary gear being stationarily mounted to one of said shaft mounts, said displacement gear being rotatable concomitantly with said winding shaft, said winding shaft being controlled by said control member to move between a locked position where said displacement gear meshes with said stationary gear and an unlocked position where said displacement gear separates from said stationary gear.

18. The control wire assembly as claimed in claim 17, wherein said shaft-limiting unit further has a resilient member sleeved on said winding shaft, said resilient member urging said winding shaft to move to the locked position.

19. The control wire assembly as claimed in claim 17, wherein said control mechanism further has an operator connector connected to an end portion of said winding shaft, said operator connector having a restricting groove, said end portion of said winding shaft having an end surface that is disposed in said restricting groove, said winding shaft having a shaft toothed portion disposed on said end surface and along an axis of said winding shaft, said control member having an operator wheel and a connecting bar extending from said operator wheel, said connecting bar having a root portion that is connected to said operator wheel, a head portion that is disposed away from said operator wheel, a main bar section that interconnects and is smaller in cross-section than said root portion and said head portion, and a bar toothed portion that is disposed on said head portion and along an axis of said connecting bar, said head portion being received and slidable in said restricting groove.

20. The control wire assembly as claimed in claim 11, wherein said positioning part is in the form of a ball.

\* \* \* \* \*